United States Patent

[11] 3,590,339

[72] Inventors William J. Bilo
Irwin;
John W. Motto, Jr., Greensburg, both of, Pa.

[21] Appl. No. 7,077
[22] Filed Jan. 30, 1970
[45] Patented June 29, 1971
[73] Assignee Westinhouse Electric Corporation
Pittsburgh, Pa.

[54] GATE CONTROLLED SWITCH TRANSISTOR DRIVE INTEGRATED CIRCUIT (THYTRAN)
12 Claims, 7 Drawing Figs.

[52] U.S. Cl. .......... 317/235 R, 317/234 R, 317/235 D, 317/235 AB, 317/235 AE, 307/305, 307/315

[51] Int. Cl. .......... H01l 19/00, H01l 11/10

[50] Field of Search .......... 317/235/22, 235/41.1, 235/44; 307/305, 315

[56] References Cited

UNITED STATES PATENTS

| | | | |
|---|---|---|---|
| 3,303,360 | 2/1967 | Gentry .......... | 307/88.5 |
| 3,325,706 | 6/1967 | Kruppa .......... | 317/235 |
| 3,437,889 | 4/1969 | Eugster .......... | 317/235 |
| 3,476,989 | 11/1969 | Miles et al. .......... | 317/235 |

*Primary Examiner*—John W. Huckert
*Assistant Examiner*—B. Estrin
*Attorneys*—F. Shapoe and C. L. Menzemer

ABSTRACT: A body of semiconductor material comprises a controlled rectifier switch and a transistor each sharing a common anode. The controlled rectifier provides the base drive which is necessary to keep the transistor in an "on" condition. Once operating, the transistor functionally does not see the controlled rectifier in the electrical circuit. When it is desired to shut off the transistor, the necessary signal is sent to the gate region of the controlled rectifier and the rectifier is turned off thereby removing the base drive from the base region of the transistor which in turn turns all of the regions of the transistor off substantially simultaneously. This type of device is designated by the term "THYTRAN."

WITNESSES

Theodore F. Wrobel

Donald M. Winegar

INVENTORS
William J. Bilo and
John W. Motto, Jr.

BY C. L. Menzemer

ATTORNEY

GATE CONTROLLED SWITCH TRANSISTOR DRIVE INTEGRATED CIRCUIT (THYTRAN)

BACKGROUND OF THE INVENTION

1. Field of the Invention

This invention relates to semiconductor devices and in particular to a semiconductor controlled rectifier transistor driver integrated circuit.

2. Description of the Prior Art

Gate controlled semiconductor switches having a large cathode region surrounding a center fired gate region or partially surrounding gate regions located in the outer periphery thereof often are unable to turn off currents in excess of 50 amperes without burning out the device. During shutdown of the switch areas under the massive cathode contact nearest to the gate turnoff or shutoff before other more remote regions thereby squeezing the remaining current to flow through the latter areas still in an "on" state condition. When the current density increases to a sufficiently high level the temperature capability of the material is exceeded, burnout occurs, and the switch is destroyed.

The turn-on capability of a gate controlled semiconductor switch is improved when a pilot controlled rectifier is integrated with a main controlled rectifier within the same body of semiconductor material. A small gate current of the pilot controlled rectifier is amplified as the cathode current of the same and is employed as the gate current for turning "on" the main controlled rectifier. However, the turning off of the pilot controlled rectifier does not turn off the main controlled rectifier. To turn the main controlled rectifier off other means are still required.

SUMMARY OF THE INVENTION

In accordance with the teachings of this invention there is provided a semiconductor device which combines a controlled rectifier and a transistor, so that both have a common anode, and which function so that the controlled rectifier provides the base drive to keep the transistor in the "on" condition, and it is turned off by the necessary signal to the gate region of the controlled rectifier. Structurally the device comprises a wafer of semiconductor material having a top surface, a bottom surface and four regions of alternate type semiconductivity. The first and the third regions are of a first type semiconductivity and the second and fourth regions are of a second type semiconductivity. A PN junction is formed by each pair of contiguous surfaces of regions of different type semiconductivity. The third and the fourth regions each have surfaces which comprise the bottom surface of the wafer. The surface of the fourth region is centrally disposed within the bottom surface. The device is either of a planar configuration or of a mesa configuration. The first and second regions each have surfaces comprising the top surface of the wafer. The second region comprises at least two portions. A first portion is axially disposed and has a surface comprising the center portion of the top surface. A second portion of the second region is radially spaced from the first portion of the second region, by a first portion of the first region; each of the second portion and the first portion of the second region having surfaces comprising the top surface of the body. A second portion of the first region has a surface comprising the top surface of the body and is radially spaced apart from the first portion of the first region by the second portion of the second region.

An electrical contact affixed to the surface of the first portion of the second region enables one to make an external electrical connection to the second region. Electrical contacts affixed to the surfaces of the first portion of the first region and to the second portion of the second region enables one to electrically connect these two portions together electrically. An electrical contact affixed to the surface of the second portion of the first region enables one to provide an external electrical connection to the second region. An external electrical connection to the third and the fourth regions is obtained by use of an electrical ohmic contact affixed to the bottom surface of the wafer. The contacts to the various regions can be soldered or they can be compression bonded contacts.

DRAWINGS

DESCRIPTION OF THE INVENTION

Figure 1:
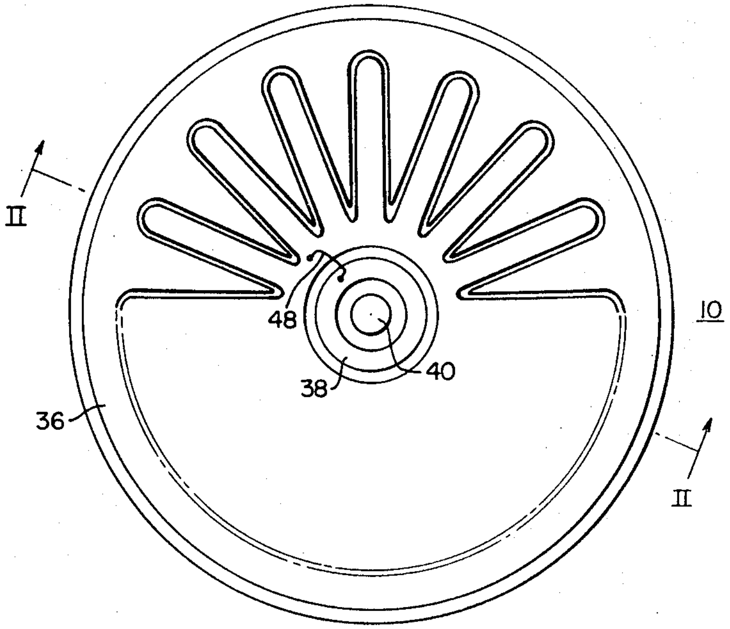
FIG. 1 is a planar view of a semiconductor device made in accordance with the teachings of this invention.
Figure 2:
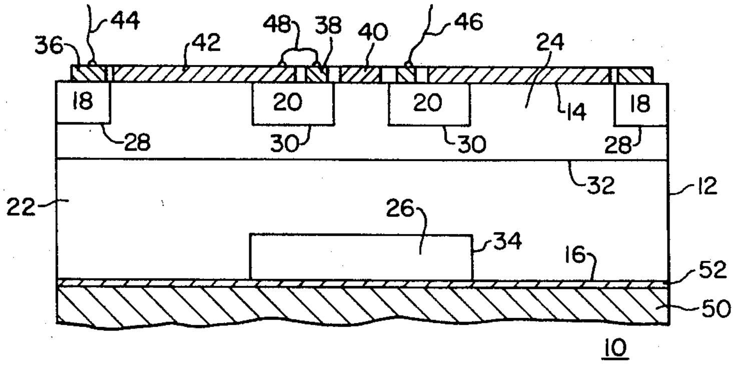
FIG. 2 is an elevational view, in cross section, of the semiconductor device of FIG. 1 taken along the line II–II and made in accordance with the teachings of this invention.

Referring now to FIGS. 1 and 2 there is shown a semiconductor device or element 10 comprising a body 12 of semiconductor material having a top surface 14 and a bottom surface 16. The semiconductor material comprising the body 12 may be silicon, germanium, silicon carbide, a compound of a Group II element and a Group VI element or a compound of a Group III element and a Group V element such as gallium arsenide or aluminum phosphide. In order to describe the invention more specifically the body 12 will be described as being of silicon semiconductor material.

The body 12 of the element 10 has regions 18, 20, and 22 of first type semiconductivity and regions 24 and 26 of a second and opposite type semiconductivity. PN junctions 28, 30, 32 and 34 are formed by the contiguous surfaces of regions 18 and 24, 20 and 24, 22 and 24, and 22 and 26 respectively of opposite type semiconductivity. The element 10 may have a PNPN configuration or an NPNP configuration and be of an all diffused structure or a combination diffused and alloyed structure.

As shown in FIG. 1 the element 10 is of an NPNP configuration wherein regions 22, 24 and 26 may be formed by any suitable double diffusion of P-type impurity material into a suitably prepared N-type substrate. Regions 18 and 20 may be formed by diffusion or by recrystallization of the respective portions of region 24 when electrically conductive metal contacts 36, 38, 40 and 42 comprising a suitable doping material such as aluminum or antimony in silver, are affixed to the top surface of the regions 18, 20 and 24 and portions thereof, by any suitable alloying process known to those skilled in the art. An electrical lead 44 is affixed to the contact 36 and an electrical lead 46 is affixed to the contact 40. An interconnecting electrical lead 48 is affixed to contacts 38 and 42 electrically joining together region 20 and that portion of region 24 between regions 18 and 20 and effectively shorting out the PN junction 30. An electrically conductive support member 50 comprising a material selected from the group consisting of molybdenum, tungsten, tantalum and combinations and base alloys thereof is suitably joined to the bottom surface 16 of the body 12 by employment of a suitable layer 52 of ohmic electrical solder material thereby providing an ohmic electrical contact between the member 50 and the regions 26 and 22 of the element 10.

The process of making the element 10, including the steps, for example, by beveling the wafer and coating of the circumferential edge of the element 10 which are not shown, since such optional processing and treatment of the element 10 is well known in the art and not pertinent to the invention herein.

Figure 3:
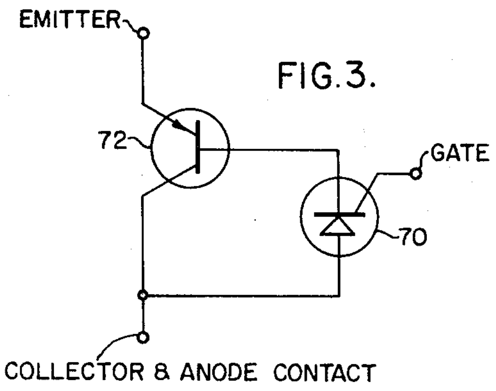
FIGS. 3 and 4 are each a different form of an electrical schematic diagram of the semiconductor device of FIG. 2.
Figure 4:
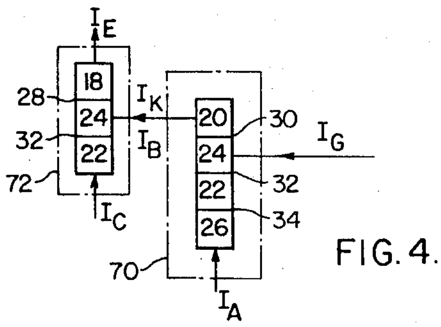

With reference to FIGS. 3 and 4 which illustrate the circuit relations of the components of the element 10, a pilot controlled rectifier 70 is integral with, and supplies the base drive for a transistor 72. The pilot controlled rectifier 70 comprises regions 26, 22, 24 and 20 and the respective PN junctions 34, 32 and 30 therebetween. The transistor 72 comprises regions 22, 24 and 18 and the respective PN junctions 32 and 28.

When an electrical potential is established across the element via lead 44 and member 50 and a positive pulse of electricity is fed to lead 46, the pilot controlled rectifier 70 is the first component of the element 10 which is turned "on" when current $I_G$ triggers the device "on." The cathode current $I_K$ of the rectifier 70 is employed as the base current $I_B$ to provide the necessary base drive to turn the transistor 72 "on." This current $I_B$ or $I_K$ continuing to flow provides the necessary base drive to keep the transistor 72 in the "on" state. Once turned "on" the transistor 72 functionally does not see the rectifier 70 in the circuit except for the fact that the portion of the anode current to element 10 which is being caused to flow through the rectifier 70 is amplified and supplied to the base region 24 of the transistor 72 to provide the necessary sustaining base drive for the transistor 72.

When it is desired to turn the transistor 72, and therefore the element 10, off one need only apply a negative gate pulse through lead 46. The controlled rectifier 70 is now effectively injected into the electrical circuit of the transistor 72. The negative pulse through lead 46 "turns off" the controlled rectifier 70 and therefore there is no longer a current $I_K$ which is flowing. Since $I_K$ is also $I_B$ or the base drive for transistor 72, the stopping of the flow of current $I_K$ removes the base drive of transistor 72 and the transistor 72 is turned off.

Since element 10 can be designed to handle sustaining currents of 50, 100 and more amperes, the net result is that element 10 is functioning as a high current gate controlled switch. As a high current gate controlled switch element 10 is producing a high current output from a small current input, the amplification coming both from the controlled rectifier 70 and the designed gain of the transistor 70.

The element 10 is not a Darlington-type structure since in a Darlington-type structure, the same electrical device is employed to drive a second electrical device of the same type such, for example, as a first or pilot controlled rectifier driving a second controlled rectifier.

The element 10 has several advantages over prior art devices embodying a first controlled rectifier driving a second controlled rectifier. First the gate lead of the element 10 can receive a pulse which will turn off the pilot controlled rectifier which in turn turns off the transistor. In prior art devices, the turning-off of the pilot controlled rectifier does not turn off the controlled rectifier it is driving. The pilot rectifier can only turn this second controlled rectifier on. Additionally, the prior art device embodying the two controlled rectifiers cannot produce a greater current than what is flowing in any portion of the circuit because the prior art device embodies a parallel electrical circuit arrangement. The element 10 however produces a greater current than the prior art devices since it still basically is only a transistor which will amplify the current input, the pilot controlled rectifier turning it on and off and supplying the base drive current.

Employing the requirements and designs of a high-voltage transistor, low gain requirements of element 10 permit low lifetime in a wide base region 24 design thereby permitting high volt-ampere-Hertz switching capability for the element 10.

While basically a transistor, the element 10 has good surge current capability. This capability is derived from the controlled rectifier 70 which drives the transistor 72 proportionally to the current surge until the transistor 72 current gain fall-off is achieved. The element 10 also has the additional surge current capability through employment of the integral controlled rectifier and the transistor base to emitter junction 28.

The element 10 operates in the same manner as a high current gate controlled switch because it can be turned "on" or "off" by a pulse of electrical current through lead 44.

Although the element 10 is basically a transistor, it will be substantially free of secondary breakdown destruction. Should element 10 be required to switch off a high inductive loading, the voltage of the element 10 will be suppressed to less than the breakover voltage of the pilot controlled rectifier. If not, the element 10 turns "on" as a two terminal semiconductor device.

In the element 10, the controlled rectifier 70 can be designed with a relatively high forward voltage drop. This normal disadvantage for a controlled rectifier can be tolerated since the element 10 has the transistor 72 which conducts the full load current at the same forward voltage drop but at a much higher current. This higher current is due to the multiple achieved by the transistor action wherein the common emitter current gain is several times higher than the gate controlled rectifier current.

When the element 10 embodies a power transistor, the pilot controlled rectifier regulates the power transistor just outside of the saturation conduction mode thereby permitting nonsaturated switching of the power transistor. This enables the transistor and the element 10 embodying it to have a faster turnoff than prior art high current gate controlled switches.

Figure 5:
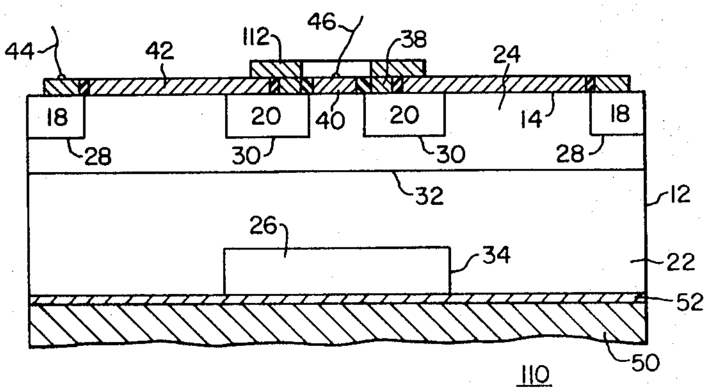
FIG. 5 is an elevational view, in cross section, of an alternate embodiment of the semiconductor device of FIG. 2 made in accordance with the teachings of this invention.

Referring now to FIG. 5 there is shown a device or element 110 which is an alternate embodiment of element 10. Element 110 is exactly the same as element 10 except that an electrically conductive bridging member 112 is employed to electrically connect region 20 with that portion of the base region 24 beneath the contact 42 through the respective electrical contacts 38 and 42. The member 112 may be integral with, or separate from the contacts 38 and 42. Additionally, although not required, a layer 114 of an electrically insulating material such, for example, as silicon oxide, silicon nitride, and silicon oxide-silicon nitride composite, may be disposed on exposed portions of the surface 14 between contacts 40 and 38 and 38 and 42 to electrically insulate the respective contacts from each other and to protect exposed portions of PN junction 30. Additionally a layer of the same type insulating materials as used in layer 114 may be employed to protect exposed portions of PN junctions 28 and 32.

It is desirable that the resistance of the contact 112 be readily adjustable to meet design requirements and it is therefore desirable that the contact 112 be a separable member. Therefore, as shown in FIG. 5, the contact 112 of element 110 electrically connects contacts 38 and 42 together by a pressure electrical contact means. The bridging contact member 112 may be made of a 80 percent nickel—20 percent chromium alloy (resistivity of about 100 microhm-cm.) or a metal with resistance of the order of 10 to $1,000 \times 10^{16}$ ohm cm. or even be fabricated from an electrically conductive ceramic material such as a spinel or titanate or niobate, molybdenum disilicide, and NiAl having similar range of predetermined resistivity whereby it also functions as an external limit resistor. This arrangement along with the design of the pressure electrical contact assembly embodying member 112 improves the removal of heat from the element 110 and the efficiency of the element 112 is increased remarkably, with the improvement making possible thermal dissipation occurring remote from the body 110. Contact member 112 may comprise a separable slug of metal or the electrically conductive ceramic in an electrode holder so that it can be easily changed to obtain the desired resistance value in the contact member 112. The member 112 may be a single continuous piece or consist of two or more arcuate members. The layer 114 of electrically insulating material may be omitted if one desires, however, its presence is preferred to assure the electrical integrity of the element 110.

Figure 6:
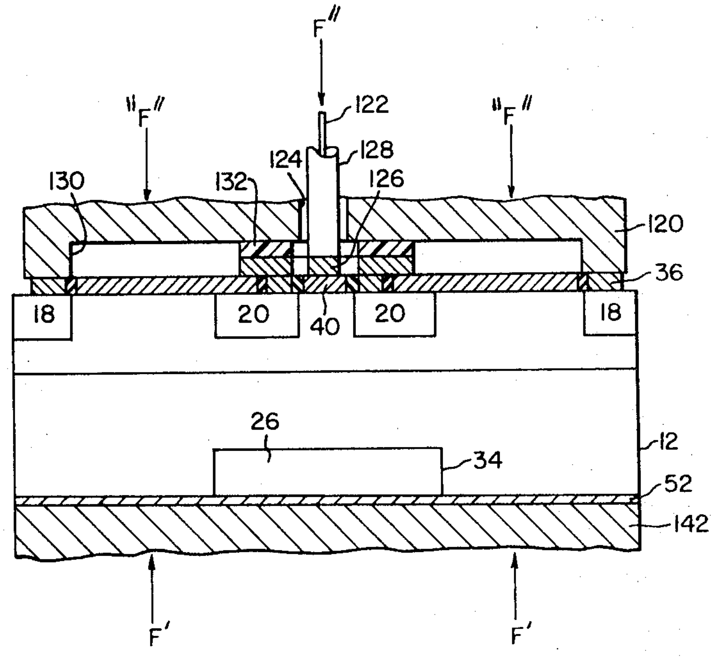
FIG. 6 is an elevational view, partly in cross section, of a portion of an electrical device made in accordance with the teachings of this invention.

The element 110 is suitable for use in a compression bonded encapsulated electrical device as shown in FIG. 6. A large area electrical contact 120 comprising an electrically conductive material such, for example, as copper is disposed upon the contact 36 and held in a pressure electrical contact therewith by suitable resilient force means such as a spring, indicated by the force lines "F." A gate lead 122 extends downwardly through an aperture 124 in the contact 120 and terminates in a buttoneshaped contact member 126 held in a pressure electrical contact relationship with contact 40 by a force "F" suitably applied, such, for example, as by resilient force means acting on the lead 122. The lead 122 is encased in a cylindrical tube or jacket 128 of an electrically insulating material to prevent electrical short-circuiting from occurring between lead 122 and contact 120.

The member 112 is disposed about the lead 122 in a recess 130 of the contact 120. The member 112 is electrically insulated from the contact 120 by a layer 132 of an electrically insulating material such, for example, as polytetrafluoroethylene, trifluoromonochloroethylene, a laminate of melamine resin impregnated cloth or fiber glass, or phenolic resin impregnated cloth or fiber glass. Preferably, the bridging member 112 should be easily located and oriented within the recess 130 without substantial movement or misalignment of the bridging member 112 occurring in operation.

Figure 7:
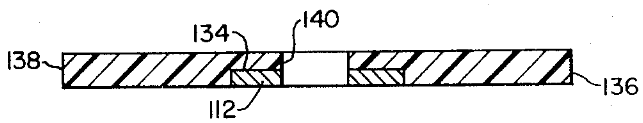
FIG. 7 is an elevational view, in cross section, of an electrical contact and an electrically insulating member suitable for use in the portion of the electrical device shown in FIG. 6.

FIG. 7 illustrates one means of aligning the bridging member 112 in the recess 130. The bridging member 112 in one or more pieces is inlaid within a recess 134 of a body 136 of one of the insulating materials described as comprising the member 132. Preferably the body 136 has an outer peripheral portion 138 to prevent electrical short-circuiting between member 112 and 120 from occurring. Alignment is achieved by having the gate lead jacket 128 extend downwardly through aperture 140 which extends entirely through the body 136.

Preferred materials for the body 136 is polytetrafluoroethylene and trifluoromonochloroethylene. These materials have physical properties which allow them to cold flow under local high pressure. The cold flow proceeds only to a given limit when the pressure is distributed over a larger area and then essentially ceases, whereupon the body 136 acts as a rigid member. Upon assuming this condition the material of the body 136 transmits to contact 112 and so on any force applied to the body 136 without further appreciable cold flow occurring. Employment of these members enables one to substantially eliminate any problems which manufacturing tolerances of the components may give which could cause poor electrical contact or no contacting at all from occurring between electrically conductive members resulting in an inoperative electrical device.

The element 110 is supported by a thermally and an electrically conductive support member 142 within a hermetically sealed encapsulation envelope which encloses the contact 120, the associated components of same and the resilient force means acting on both the contact 120 and the gate lead 122. The application of the force "F" causes the support member 142 to produce a reactive force 'F' which in combination with the force "F" produces the pressure electrical contact relationship between contact 120, gate lead 122, bridging member 112 and the support member 142 with the respective portions of the element 110.

Although the elements 10 and 110 have been illustrated and described essentially as planar devices, the device of the invention may also be made in a mesa configuration with either regions 20 and 18 or region 24 projecting above the other corresponding regions of opposite type semiconductivity which comprises the top surface 14.

We claim as our invention:

1. A semiconductor device comprising a wafer of semiconductor material, said wafer having a top surface, a bottom surface and four regions of alternate type semiconductivity, the first and third regions having a first type semiconductivity and the second and fourth regions having a second type semiconductivity;

a PN junction formed by each pair of contiguous surfaces of regions of different type semiconductivity;

said third and said fourth regions having surfaces comprising the bottom surface of said wafer, said bottom surface of said fourth region being disposed centrally within said bottom surface of the wafer;

said first and said second regions each having surfaces comprising at least in part the top surface of said wafer;

said first region comprising at least two portions radially spaced apart from each other and from the center of the wafer, and having portions of the surface of the second region comprising the top surface of the wafer exposed therebetween, a first portion of the first region encircling at least in part a first portion of the surface of the second region, said first portion of the second region being centrally disposed within the wafer's top surface and the second portion of said first region being larger than said first portion of said first region and encircling at least in part a second portion of the surface of the second region;

a first electrical contact affixed to the first portion of the second region;

a second electrical contact affixed to the first portion of the first region;

a third electrical contact affixed to the second portion of the second region;

a fourth electrical contact affixed to the second portion of the first region;

a fifth electrical contact affixed to the surface of the third and the fourth regions which comprises the bottom surface of the wafer; and an electrically conductive connection electrically connecting said second and third electrical contacts.

2. The electrical device of claim 1 wherein said electrically conductive connection and said second and said third electrical contacts are integral with each other and form a unitary electrical contact.

3. The electrical device of claim 1 wherein portions of said second region comprise alloyed and recrystallized portions and said first, said second, said third, and said fourth electrical contacts are each affixed to the alloyed and recrystallized portion of said second region.

4. The semiconductor device of claim 2 including a layer of an electrically insulating material disposed on at least that portion of the top surface of said body between said second and said third electrical contact portions of said unitary electrical contact including an end portion of that PN junction formed between said first portion of said first region and said second portion of said second region exposed in said at least that portion of the top surface.

5. The electrical device of claim 1 wherein said electrically conductive connection is in a pressure electrical contact relationship with said second and said third electrical contacts.

6. The electrical device of claim 5 wherein said electrically conductive connection comprises an electrically conductive metal having a predetermined resistivity.

7. The electrical device of claim 6 wherein said electrically conductive connection comprises an electrically conductive ceramic body having a predetermined resistivity.

8. The electrical device of claim 5 including a sixth electrical contact in a pressure electrical contact relationship with said fourth electrical contact, said sixth electrical contact having a top surface, a bottom surface, an axially disposed recess formed in the bottom surface and extending radially outwardly from the center of the sixth electrical contact and having a third surface substantially parallel to and intermediate of said top and bottom surfaces, sidewalls extending from said third surface to said bottom surface, and an axially disposed aperture extending through said sixth contact from said top surface to said third surface of said recess; and said electrically conductive connection is disposed about the aperture of said sixth contact within said recess and electrically insulated from said sixth electrical contact by a layer of electrically insulating material whereby said sixth electrical contact acts on said electrically insulating material and said electrically conductive connection to urge said electrically conductive connection into the pressure electrical contact relationship with said second and said third contacts.

9. The semiconductive device of claim 8 including an electrical lead extending axially downwardly through the aperture of said sixth electrical contact, through an axially disposed aperture extending entirely through said layer of electrically insulating material, through an axially disposed aperture extending entirely through said electrically conductive connection to electrically connect with said first electrical contact in a pressure electrical contact relationship.

10. The semiconductor device of claim 9 wherein said layer of electrically insulating material has an axially disposed boss which protrudes downwardly through the aperture of said electrically conductive connector, the aperture of said layer of electrically insulating material being axially disposed within the boss.

11. The semiconductor device of claim 10 wherein said layer of electrically insulating material has an outer peripheral portion which encloses the outer peripheral surface of said electrically conductive connection whereby said electrically conductive connection is disposed in a recess formed within the insulating material.

12. The electrical device of claim 11 wherein said layer of electrically insulating material comprises a material selected from the group consisting of polytetrafluoroethylene and trifluoromonochloroethylene.